(12) United States Patent
Hsu et al.

(10) Patent No.: US 11,758,699 B2
(45) Date of Patent: Sep. 12, 2023

(54) CHARGING MODULE FOR ELECTRIC VEHICLE

(71) Applicant: DELTA ELECTRONICS, INC., Taoyuan (TW)

(72) Inventors: Jui-Yuan Hsu, Taoyuan (TW); Ming-Hsien Hsieh, Taoyuan (TW); Kai-Hung Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 306 days.

(21) Appl. No.: 17/164,986

(22) Filed: Feb. 2, 2021

(65) Prior Publication Data

US 2022/0078948 A1 Mar. 10, 2022

(30) Foreign Application Priority Data

Sep. 4, 2020 (CN) .......................... 202010919421.X

(51) Int. Cl.
*H05K 7/20* (2006.01)
*B60L 53/20* (2019.01)
(Continued)

(52) U.S. Cl.
CPC .......... *H05K 7/20927* (2013.01); *B60L 53/20* (2019.02); *B60L 53/302* (2019.02); *B60L 53/50* (2019.02); *H02J 7/0042* (2013.01); *H05K 7/20263* (2013.01); *H05K 7/20272* (2013.01); *B60L 2210/10* (2013.01); *B60L 2210/30* (2013.01); *B60L 2210/40* (2013.01); *H02J 2207/20* (2020.01)

(58) Field of Classification Search
CPC ............................ H05K 7/20927; B60L 53/20

USPC .......................................................... 320/109
See application file for complete search history.

(56) References Cited

U.S. PATENT DOCUMENTS 9,260,025 B1 * 2/2016 McGrath ................ F24H 9/0063
11,214,159 B2 * 1/2022 Heyne ..................... B60L 53/53
(Continued)

FOREIGN PATENT DOCUMENTS

JP 2003202132 A 7/2003
JP 2004343924 A 12/2004
(Continued)

OTHER PUBLICATIONS

Office Action dated Sep. 6, 2022 in JP Application No. 2021-026180, 5 pages.
(Continued)

*Primary Examiner* — Suchin Parihar
(74) *Attorney, Agent, or Firm* — Muncy, Geissler, Olds & Lowe, P.C.

(57) ABSTRACT

A charging module for electric vehicle includes a power conversion unit, a heat dissipation unit, and a thermoelectric module. The power conversion unit includes a power conversion module disposed inside a cabinet, and the power conversion unit provides output power. The heat dissipation unit cools the power conversion unit through liquid cooling or air cooling. The thermoelectric module generates electrical energy based on a temperature difference between the power conversion unit and the heat dissipation unit during operation. The electrical energy is supplied to the power conversion unit and/or the heat dissipation unit.

18 Claims, 8 Drawing Sheets

(51) Int. Cl.
*B60L 53/50* (2019.01)
*B60L 53/302* (2019.01)
*H02J 7/00* (2006.01)

(56) References Cited

U.S. PATENT DOCUMENTS

| | | | |
|---|---|---|---|
| 2006/0090787 A1* | 5/2006 | Onvural | H10N 10/81 136/212 |
| 2007/0084496 A1 | 4/2007 | Edey | |
| 2010/0112419 A1 | 5/2010 | Jang et al. | |
| 2011/0266996 A1* | 11/2011 | Sugano | B60L 3/04 320/104 |
| 2014/0007594 A1* | 1/2014 | Lofy | H05K 7/20845 62/3.2 |
| 2020/0406770 A1* | 12/2020 | Ruppert | H02J 7/0042 |
| 2021/0129694 A1* | 5/2021 | Laemmle | B60L 53/12 |
| 2022/0219555 A1* | 7/2022 | Hsu | B60L 53/16 |

FOREIGN PATENT DOCUMENTS

| | | |
|---|---|---|
| JP | 2005026473 A | 1/2005 |
| JP | 2009194019 A | 8/2009 |
| JP | 2010532066 A | 9/2010 |
| JP | 2013134033 A | 7/2013 |
| JP | 2014032920 A | 2/2014 |
| JP | 2016208834 A | 12/2016 |
| JP | 2018125949 A | 8/2018 |
| TW | M-566912 U | 9/2018 |

OTHER PUBLICATIONS

Office Action dated Mar. 28, 2023 of the corresponding Japan patent application No. 2021-026180.

* cited by examiner

CHARGING MODULE FOR ELECTRIC VEHICLE

BACKGROUND

Technical Field

The present disclosure relates to a charging module for electric vehicle, and more particularly to an electric vehicle charging module capable of being self-powered by recovering heat energy.

Description of Related Art

The statements in this section merely provide background information related to the present disclosure and do not necessarily constitute prior art.

Electric vehicle charging modules with power conversion function are essential components for general electric vehicle charging systems, used to convert electricity and supply the electricity to electric vehicles through charging apparatus. During operation, most conventional electric vehicle charging modules with cabinet-type power conversion devices use air or liquid to dissipate the heat generated by the power conversion devices. Please refer to FIG. 1 and FIG. 2, which show schematic diagrams of exemplary conventional electric vehicle charging modules using air cooling and liquid cooling for heat dissipation, respectively.

FIG. 1 is a schematic diagram of an exemplary conventional electric vehicle charging module using air cooling manner. The cold air is drawn/blown into the cabinet 90, and with proper air flow design, the heat generated by the power conversion device 95 inside the cabinet 90 can be carried by the air and exhausted out of the cabinet 90, thereby the power conversion device 95 is cooled. FIG. 2 is a schematic diagram of an exemplary conventional electric vehicle charging module using liquid cooling manner. The liquid cooling system includes a liquid cooling cooler 80, a cold liquid pipe 82 and a hot liquid pipe 84 along with liquid coolant, such as but not limited to water, circulating in the system. During operation, the heat generated by the power conversion device 95 is transferred by the liquid coolant to the liquid cooling cooler 80 through the hot liquid pipe 84, and cold liquid coolant provided by the liquid cooling cooler 80 is delivered to the power conversion device 95 through the cold liquid pipe 82 to cool the power conversion device 95. However, with the above-mentioned heat dissipation manners, the heat energy generated during operation can only be directly dissipated into the air or be exchanged from the liquid to the air by the liquid cooling cooler, that is, the heat energy is wasted in the air and cannot be used for other purposes, resulting in energy waste, environment-unfriendly, and poor economic benefit.

SUMMARY

An object of the present disclosure is to provide a charging module for electric vehicle to solve the above-mentioned problems of energy waste, environment-unfriendly, and poor economic benefit since the heat generated during operation is wasted in the air and cannot be used for other purposes.

In order to achieve the above-mentioned object, the charging module for electric vehicle according to the present disclosure includes a power conversion unit, a heat dissipation unit, and a thermoelectric module. The power conversion unit includes a power conversion module disposed inside a cabinet, and the power conversion unit provides an output power. The heat dissipation unit cools the power conversion unit. The thermoelectric module generates an electrical energy based on a temperature difference between the power conversion unit and the heat dissipation unit during operation. The electrical energy generated by the thermoelectric module is supplied to the power conversion unit and/or the heat dissipation unit.

In one embodiment, the heat dissipation unit is a liquid cooling pump when liquid cooling is performed.

In one embodiment, the heat dissipation unit and the thermoelectric module are disposed inside the cabinet.

In one embodiment, the charging module for electric vehicle further includes a first pipe and a second pipe arranged between the power conversion unit and the liquid cooling pump. Heat energy generated by the power conversion unit is transferred to the liquid cooling pump through the first pipe, and cold liquid coolant is delivered from the liquid cooling pump to the power conversion unit through the second pipe. The thermoelectric module receives a first temperature of the first pipe and a second temperature of the second pipe, and generates the electrical energy based on the temperature difference between the first temperature and the second temperature.

In one embodiment, the heat dissipation unit and the thermoelectric module are not disposed inside the cabinet.

In one embodiment, the heat dissipation unit is a cooling fan when air cooling is performed.

In one embodiment, the heat dissipation unit is disposed inside the cabinet.

In one embodiment, the thermoelectric module is arranged on the power conversion unit, receives a first temperature of the power conversion unit and a second temperature inside the cabinet, and generates the electrical energy based on the temperature difference between the first temperature and the second temperature.

In one embodiment, the thermoelectric module is arranged at an air inlet, receives a first temperature inside the cabinet and a second temperature outside the cabinet, and generates the electrical energy based on the temperature difference between the first temperature and the second temperature.

In one embodiment, the thermoelectric module is arranged at an air outlet, receives a first temperature inside the cabinet and a second temperature outside the cabinet, and generates the electrical energy based on the temperature difference between the first temperature and the second temperature.

In one embodiment, the charging module further includes a power distribution unit. The power distribution unit is disposed inside the cabinet or not inside the cabinet.

In one embodiment, the charging module further includes a first power converter, a power storage unit, and a second power converter. The first power converter is coupled to the thermoelectric module, and the first power converter receives a first power and converts the first power into a second power. The power storage unit is coupled to the first power converter, and the power storage unit receives the second power to store energy. The second power converter is coupled to the first power converter and the power storage unit, and the second power converter receives the second power and converts the second power into the electrical energy.

In one embodiment, the first power converter is an AC-to-DC converter or a DC-to-DC converter.

In one embodiment, the second power converter is a DC-to-DC converter or a DC-to-AC converter.

In one embodiment, the thermoelectric module is a thermoelectric generator.

In one embodiment, the output power is configured to be supplied to a charging apparatus.

In one embodiment, the charging module is disposed inside a charging apparatus, and the output power is supplied to the charging apparatus.

In one embodiment, the power conversion module is an AC-to-DC converter.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawings as follows.

DETAILED DESCRIPTION

Figure 1:
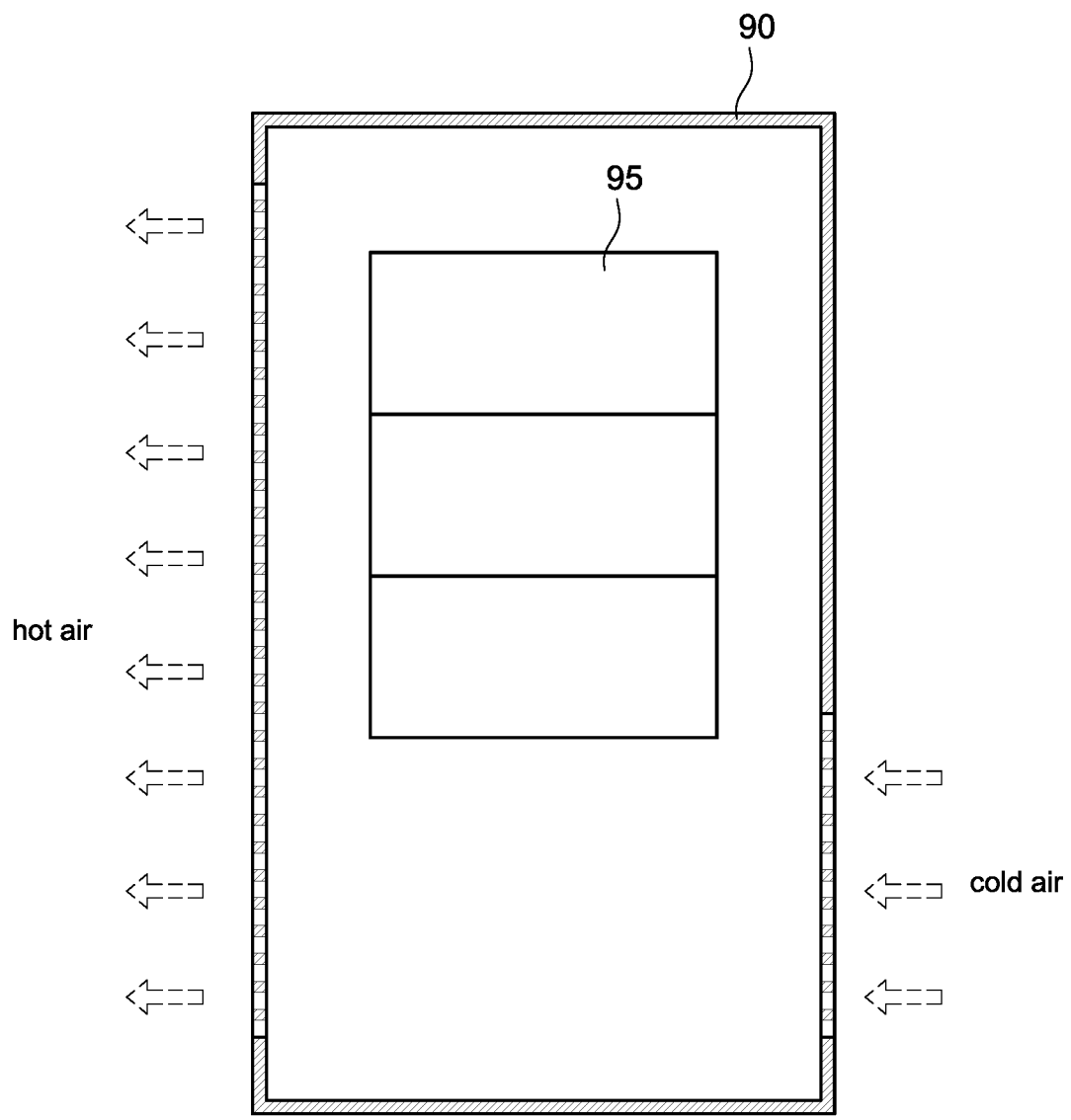
FIG. 1 is a schematic diagram of a conventional charging module for electric vehicle using air to dissipate heat.
Figure 2:
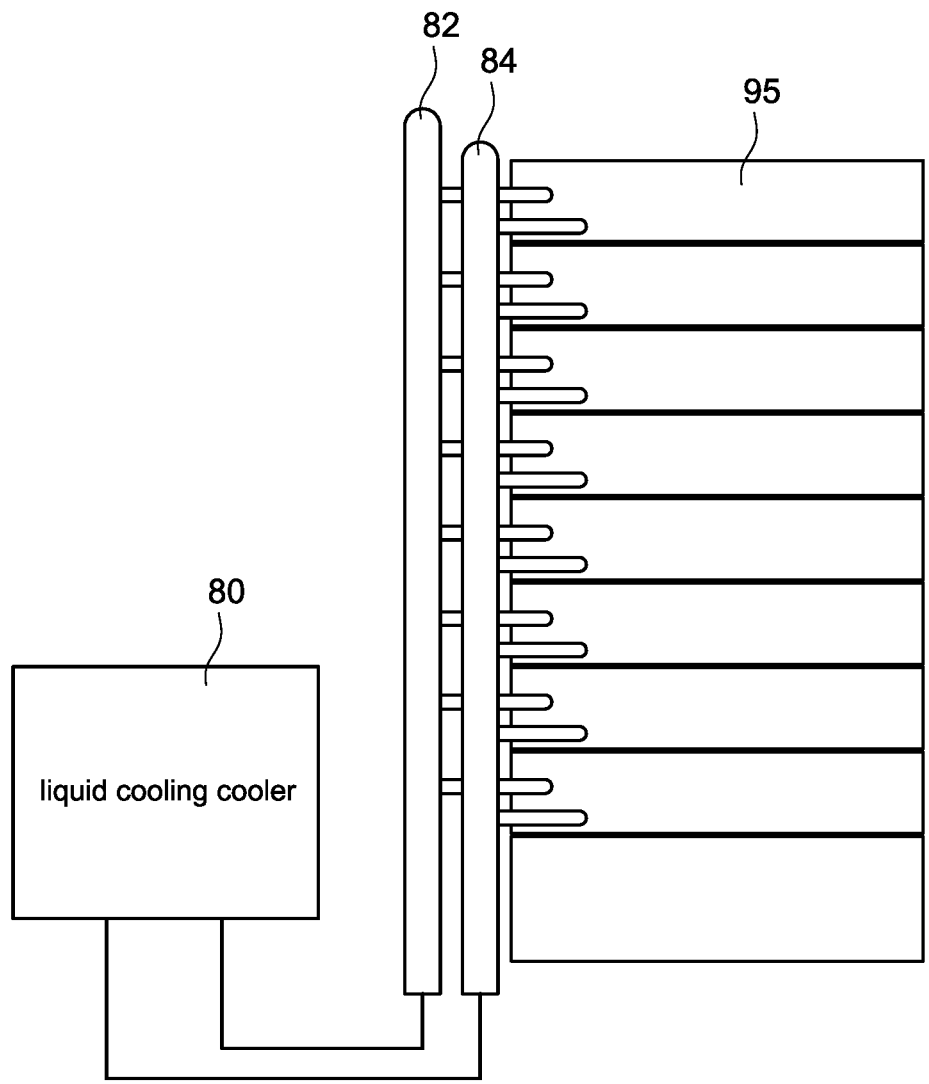
FIG. 2 is a schematic diagram of a conventional charging module for electric vehicle using liquid to dissipate heat.

Reference will now be made to the drawing figures to describe the present disclosure in detail. It will be understood that the drawing figures and exemplified embodiments of present disclosure are not limited to the details thereof.

Figure 3:
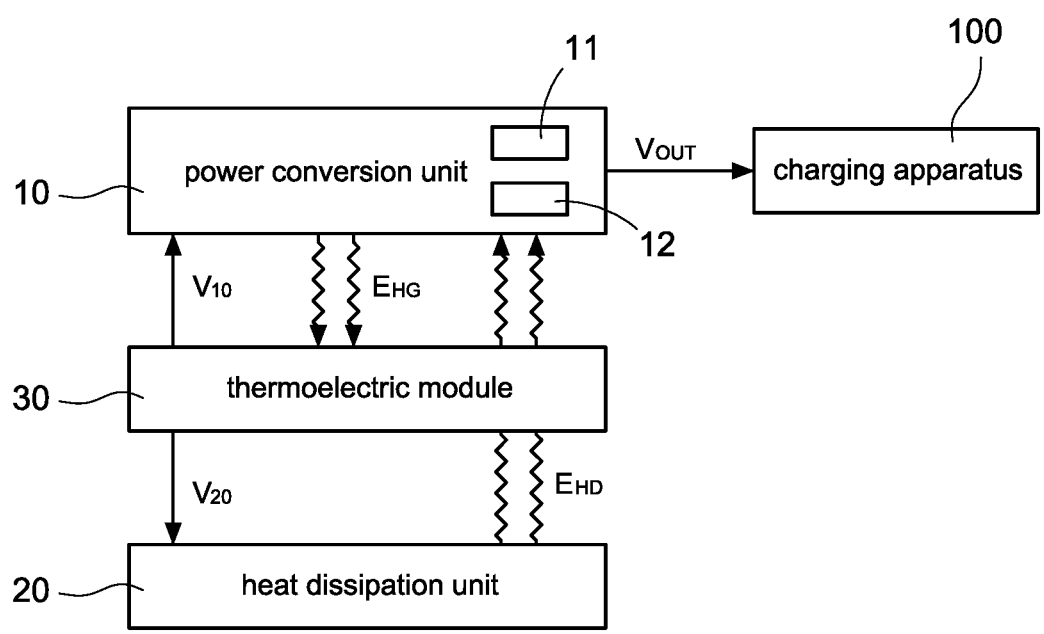
FIG. 3 is a block diagram of an exemplary charging module for electric vehicle according to the present disclosure.

FIG. 3 illustrates a block diagram of an exemplary charging module for electric vehicle according to the present disclosure. The charging module for electric vehicle (hereinafter referred to as "charging module") includes a power conversion unit 10, a heat dissipation unit 20, and a thermoelectric module 30. The power generated by the charging module is used to be supplied to a charging apparatus 100. In the embodiment shown in FIG. 3, the charging module is disposed outside the charging apparatus 100 for supplying power to the charging apparatus 100. In another embodiment, the charging module can also be disposed inside the charging apparatus 100 to supply power to the charging apparatus 100.

The charging apparatus 100 is a device that supplements electrical energy for electric vehicles, such as pure (battery) electric vehicles (PEVs/BEVs) or plug-in hybrid electric vehicles (PHEVs), and it is similar to the gas stations used by fuel vehicles. According to the type of the charging voltage of electric vehicles, charging apparatus can be generally categorized into AC charging apparatus and DC charging apparatus. In general, most of fast-charging apparatuses are DC charging apparatuses, but not all DC charging apparatuses are fast-charging apparatuses.

In the exemplary embodiment of FIG. 3, the power conversion unit 10 provides an output power $V_{OUT}$ to the charging apparatus 100, and includes a power conversion module 11 disposed inside a cabinet. In another embodiment, the power conversion unit 10 further includes a power distribution unit 12. The power distribution unit 12 may be disposed inside the cabinet or outside the cabinet. In other words, the power conversion unit 10 may include only the power conversion module 11 (inside the cabinet) or may include both the power conversion module 11 (inside the cabinet) and the power distribution unit 12 (inside or outside the cabinet). The power conversion module 11 has power conversion circuits for power conversion. The power distribution unit 12 (PDU, or referred to as "power distributor") is used for distributing power from a power source to the power conversion unit 10 and may have safety functions such as protection and warning. If the power distribution unit 12 is disposed inside the cabinet, it may be a rack power distribution unit (rPDU), which can make the power distribution of peripheral devices more efficient and meet high density requirements for space usage according to different customer needs.

The heat dissipation unit 20 performs liquid cooling or air cooling for the power conversion unit 10. As shown in FIG. 3, the power conversion module 11 and the power distribution unit 12 of the power conversion unit 10 generate heat energy $E_{HG}$ during the process of supplying power to the charging apparatus 100, that is, during the process of supplying power to the charging apparatus 100, the power conversion unit 10 can be regarded as a heat source. Thus, to reduce the temperature of the power conversion unit 10, the heat dissipation unit 20 performs liquid cooling or air cooling and provides the cooling means $E_{HD}$ to the power conversion unit 10.

When a hot end (high-temperature end) and a cold end (low-temperature end) of the thermoelectric module 30 are respectively in contact with (receive) different temperatures at the same time, that is, a higher temperature caused by the heat energy $E_{HG}$ and a lower temperature caused by the liquid or air cooling means $E_{HD}$, the temperature difference will cause the electrons to flow between the hot end and the cold end, which forms an electrical current, and such process of converting heat energy into electrical energy is called a thermoelectric effect or "Peltier-Seebeck effect". In one embodiment, the thermoelectric module 30 may be a thermoelectric generator. The thermoelectric module 30 is in contact with different temperatures and converts part of the heat energy $E_{HG}$ into the electrical energy based on the temperature difference during the operation of the power conversion unit 10 and the heat dissipation unit 20. Finally, the electrical energy generated from the thermoelectric module 30 is used to provide to the power conversion unit 10 and/or the heat dissipation unit 20 for operation. In this embodiment, the thermoelectric module 30 provides a supply voltage $V_{10}$ to the power conversion unit 10, and provides a supply voltage $V_{20}$ to the heat dissipation unit 20. Accordingly, through the recovery and reuse of the heat energy, the electrical energy is generated to be supplied to the power conversion unit 10 and the heat dissipation unit 20, thereby achieving environmental protection, energy saving, and better economic benefit.

Figure 4A:
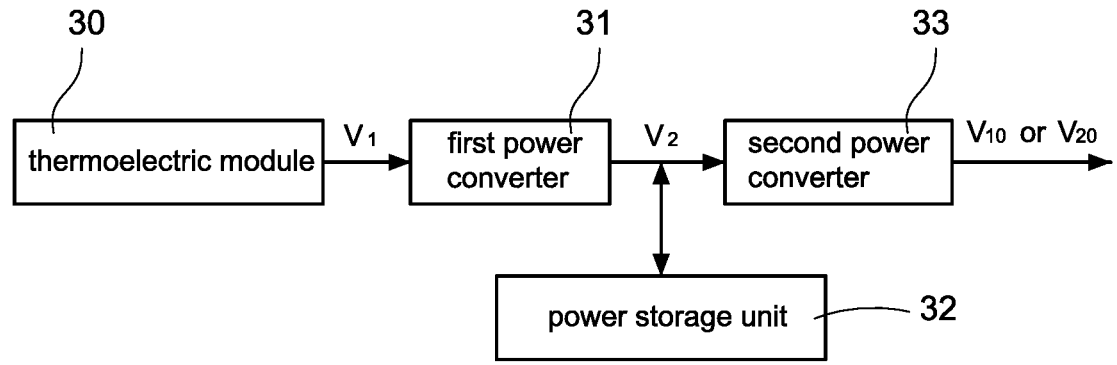
FIG. 4A is a block diagram of one embodiment of converting a voltage generated from a thermoelectric module into a supply voltage according to the present disclosure.
Figure 4B:
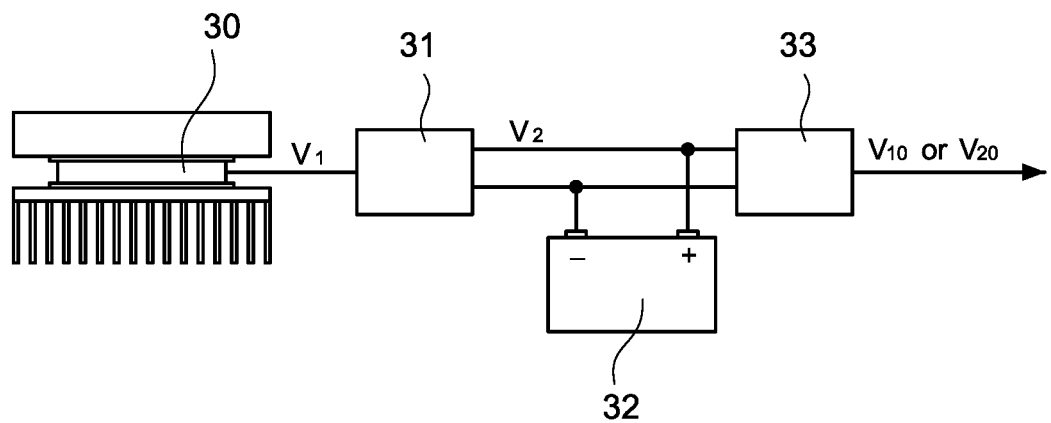
FIG. 4B is a schematic view of the embodiment of converting a voltage generated from a thermoelectric module into a supply voltage shown in FIG. 4A.

FIG. 4A and FIG. 4B respectively illustrate a block diagram and a schematic view of one embodiment of converting a voltage generated from a thermoelectric module into a supply voltage according to the present disclosure. In one embodiment, the supply voltage $V_{10}$ for the power conversion unit 10 and the supply voltage $V_{20}$ for the heat dissipation unit 20 can be implemented by converting and storing the electricity generated by the thermoelectric module 30, described as follows. The charging module further includes a first power converter 31, a power storage unit 32, and a second power converter 33. In this embodiment, the thermoelectric module 30 is arranged between a heat source and a heat dissipator, and the heat source is the power conversion unit 10 and the heat dissipator is a heat sink. When the hot end and the cold end of the thermoelectric module 30 are in contact with (receive) different temperatures at the same time, according to the thermoelectric effect described above, the thermoelectric module 30 will convert the heat energy into the electrical energy based on the temperature difference between the hot end and the cold end.

Specifically, the first power converter 31 is coupled to the thermoelectric module 30, receives a first power $V_1$ and converts the first power $V_1$ into a second power $V_2$. In different embodiments, the first power $V_1$ outputted from the thermoelectric module 30 may be a DC power or an AC power, and therefore the first power converter 31 may be an AC-to-DC converter or a DC-to-DC converter, and may be a step-up converter for converting the first power $V_1$ with lower voltage level into the second power $V_2$ with higher voltage level, and vice versa.

The power storage unit 32 is coupled to the first power converter 31, and receives the second power $V_2$ to store energy. The power storage unit 32 can be a battery (or as "rechargeable battery").

The second power converter 33 is coupled to the first power converter 31 and the power storage unit 32, receives the second power $V_2$ and converts the second power $V_2$ into the electrical energy for providing the supply voltage $V_{10}$ to the power conversion unit 10 and/or the supply voltage $V_{20}$ to the heat dissipation unit 20. In different embodiments, the supply voltage $V_{10}$ and the supply voltage $V_{20}$ may be a DC power or an AC power, and therefore the second power converter 33 may be a DC-to-DC converter or a DC-to-AC converter.

In practical applications, moreover, the energy stored in the power storage unit 32 can be extracted, as a backup power source, for continuously providing power when the thermoelectric module 30 has no output (for example, no first power $V_1$). The stored energy is converted by the second power converter 33 into the supply voltage $V_{10}$ and/or the supply voltage $V_{20}$. Therefore, if the second power converter 33 is the DC-to-DC converter, the (DC) second power $V_2$ or the energy outputted from the power storage unit 32 can be converted into the supply voltage $V_{10}$ and/or the supply voltage $V_{20}$ as DC power supply. If the second power conversion 33 is the DC-to-AC converter, the (DC) second power $V_2$ and/or the energy outputted from the power storage unit 32 can be converted into the supply voltage $V_{10}$ or the supply voltage $V_{20}$ as AC power supply.

Figure 5:
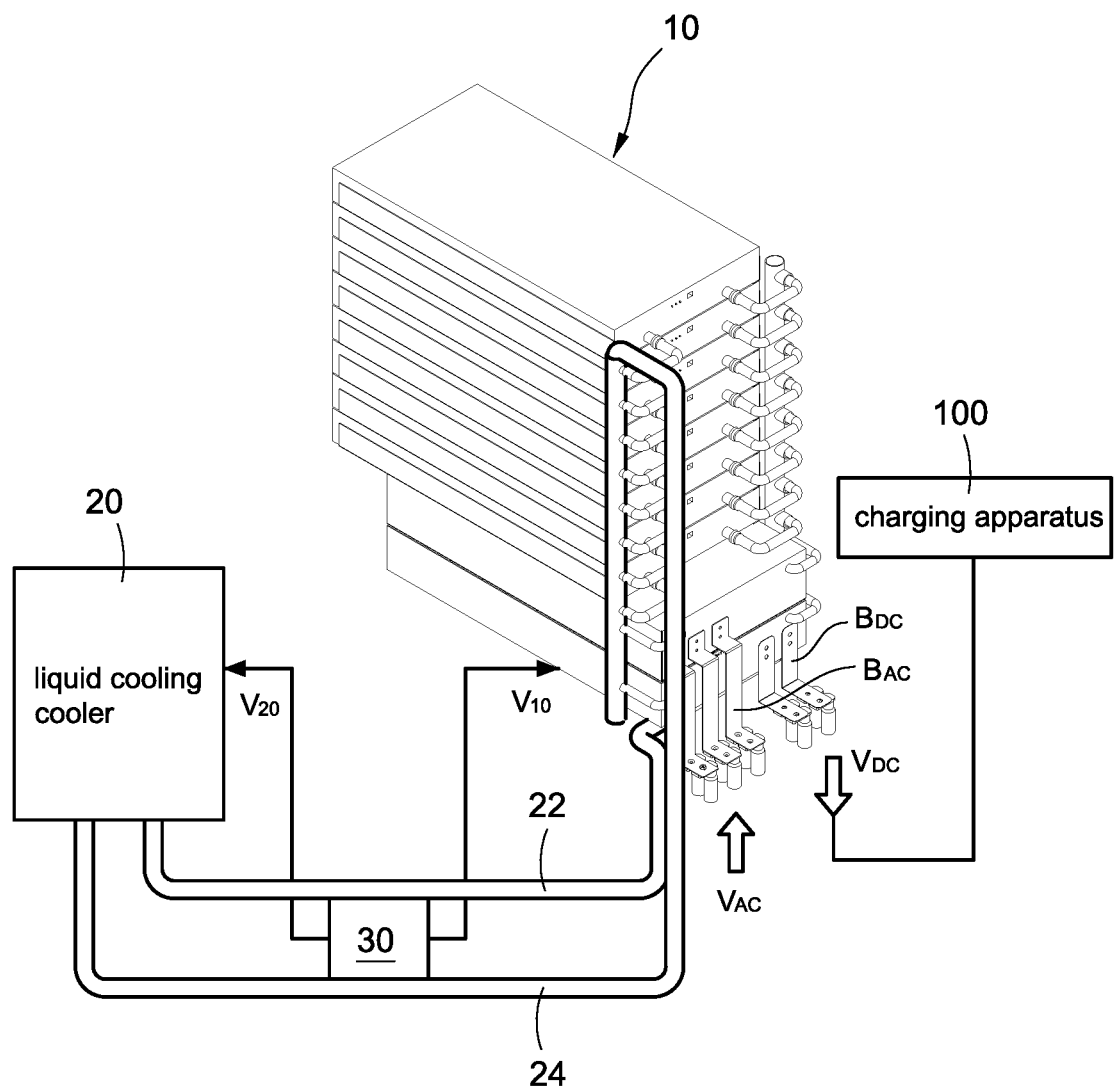
FIG. 5 is a schematic diagram of an exemplary charging module for electric vehicle using liquid to dissipate heat according to the present disclosure.

FIG. 5 illustrates a schematic diagram of an exemplary charging module for electric vehicle using liquid to dissipate heat according to the present disclosure. An AC power $V_{AC}$ is supplied to the power conversion unit 10 disposed inside the cabinet (not shown) through an AC input bus bar $B_{AC}$, and is converted by the power conversion unit 10 into a DC power VDC to be supplied to the charging apparatus 100 through a DC output bus bar $B_{DC}$. In another embodiment, the power conversion unit 10 can also provide AC power to the charging apparatus 100. A liquid cooling cooler 20 (an embodiment of the heat dissipation unit 20) having a liquid cooling pump is used with a cold liquid pipe 22 and a hot liquid pipe 24 and circulating liquid coolant so that the heat generated by the power conversion unit 10 is transferred by the liquid coolant to the liquid cooling cooler 20 through the hot liquid pipe 24, and cold liquid coolant provided by the liquid cooling cooler 20 is delivered to the power conversion unit 10 through the cold liquid pipe 22 to cool the power conversion unit 10.

Furthermore, the thermoelectric module 30 is arranged between the cold liquid pipe 24 and the hot liquid pipe, that is, two ends of the thermoelectric module 30 are in contact with (receives) two different temperatures at the same time (the temperature of the cold liquid pipe 22 is lower than the temperature of the hot liquid pipe 24), and therefore the thermoelectric module 30 can convert the heat energy into the electrical energy based on the temperature difference between the cold liquid pipe 22 and the hot liquid pipe 24. In one embodiment, the thermoelectric module 30 may directly provide the supply voltage $V_{10}$ to the power conversion unit 10 and provide the supply voltage $V_{20}$ to the liquid cooling cooler 20 as the required power for operation. Alternatively, the power outputted from the thermoelectric module 30 may be converted and stored through the power conversion and storage architecture shown in FIG. 4A or FIG. 4B for being supplied to the power conversion unit 10 and/or the liquid cooling cooler 20. This way, the thermal energy generated by the power conversion unit 10 can be converted into the electrical energy through the thermoelectric module 30, realizing thermal energy recovery and reuse so as to achieve the advantages of environmental protection, energy saving, and better economic benefit.

In other embodiments, there can be more than one thermoelectric module 30 in the charging module. In other words, the number of thermoelectric modules 30 can be plural, and the plural thermoelectric modules 30 can be arranged between the cold liquid pipe 22 and the hot liquid pipe 24 to convert the heat energy into the electrical energy based on the temperature difference between the cold liquid pipe 22 and the hot liquid pipe 24. Therefore, the supply voltage $V_{10}$ for the power conversion unit 10 and the supply voltage $V_{20}$ for the heat dissipation unit 20 can be generated by the plural thermoelectric modules 30.

In different embodiments, the liquid cooling cooler 20 (that is, an embodiment of the heat dissipation unit 20) and the thermoelectric modules 30 can be disposed outside the cabinet, or the liquid cooling cooler 20 and the thermoelectric modules 30 can be integrated inside the cabinet.

Figure 6A:
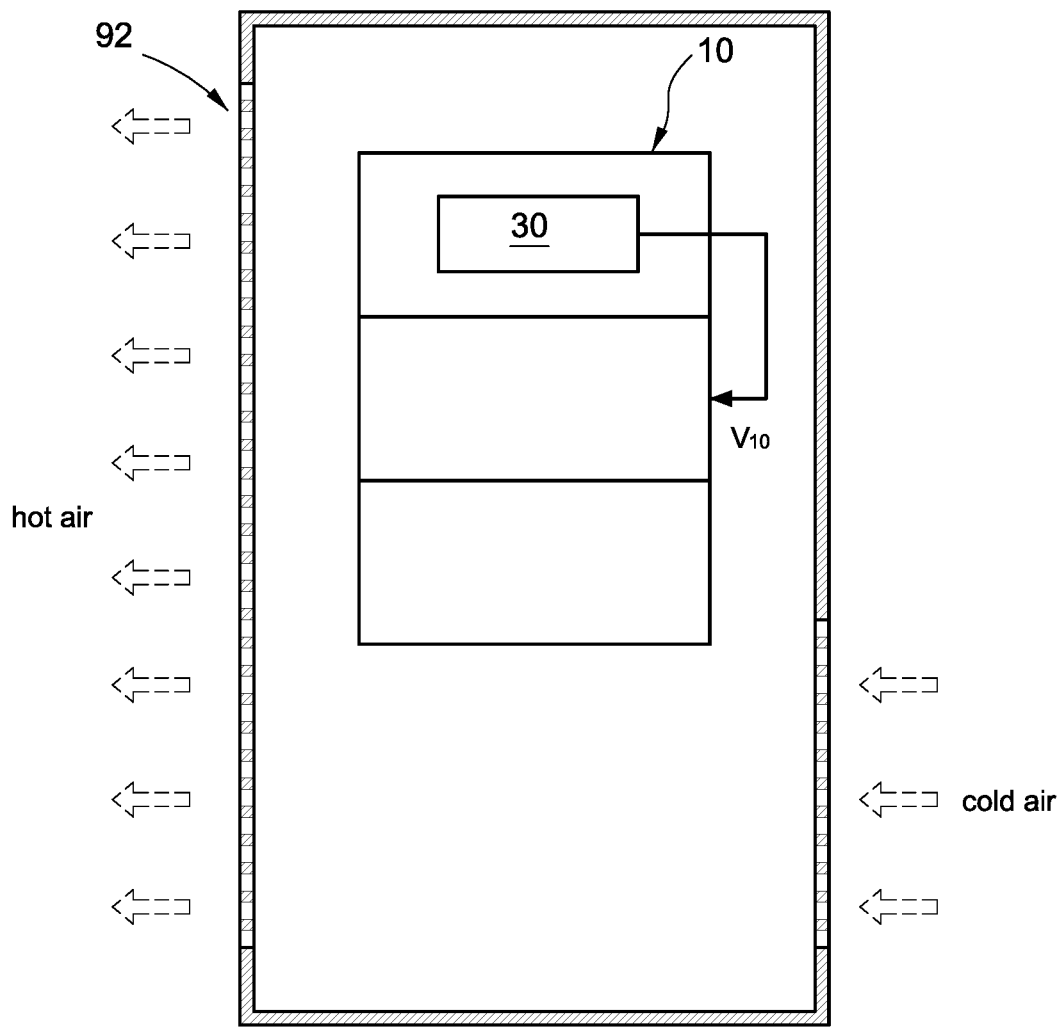
FIG. 6A is a schematic diagram of a charging module for electric vehicle using air to dissipate heat according to a first embodiment of the present disclosure.

FIG. 6A illustrates a schematic diagram of a charging module for electric vehicle using air to dissipate heat according to a first embodiment of the present disclosure. In this embodiment, the thermoelectric module 30 is arranged on the power conversion unit 10, that is, the thermoelectric module 30 may be arranged on the power conversion module 11 and/or the power distribution unit 12 depending on which generates more heat energy. The cold air is drawn/blown into the cabinet and carries the heat generated by the power conversion unit 10 out of the cabinet, thereby cooling the power conversion unit 10. During the heat dissipation, one end of the thermoelectric module 30 is in contact with the power conversion unit 10 to receive the temperature (first temperature) of the power conversion unit 10. Meanwhile, the other end of the thermoelectric module 30 also receives the internal temperature (second temperature) of the cabinet. Therefore, with two ends of the thermoelectric module 30 in contact with (receives) two different temperatures at the same time (that is, the first temperature is higher than the second temperature), the thermoelectric module 30 can convert the heat energy into the electrical energy and provide the supply voltage $V_{10}$ to the power conversion unit 10 and a supply voltage to a fan device or a heat dissipation fan (not shown) for operation.

Figure 6B:
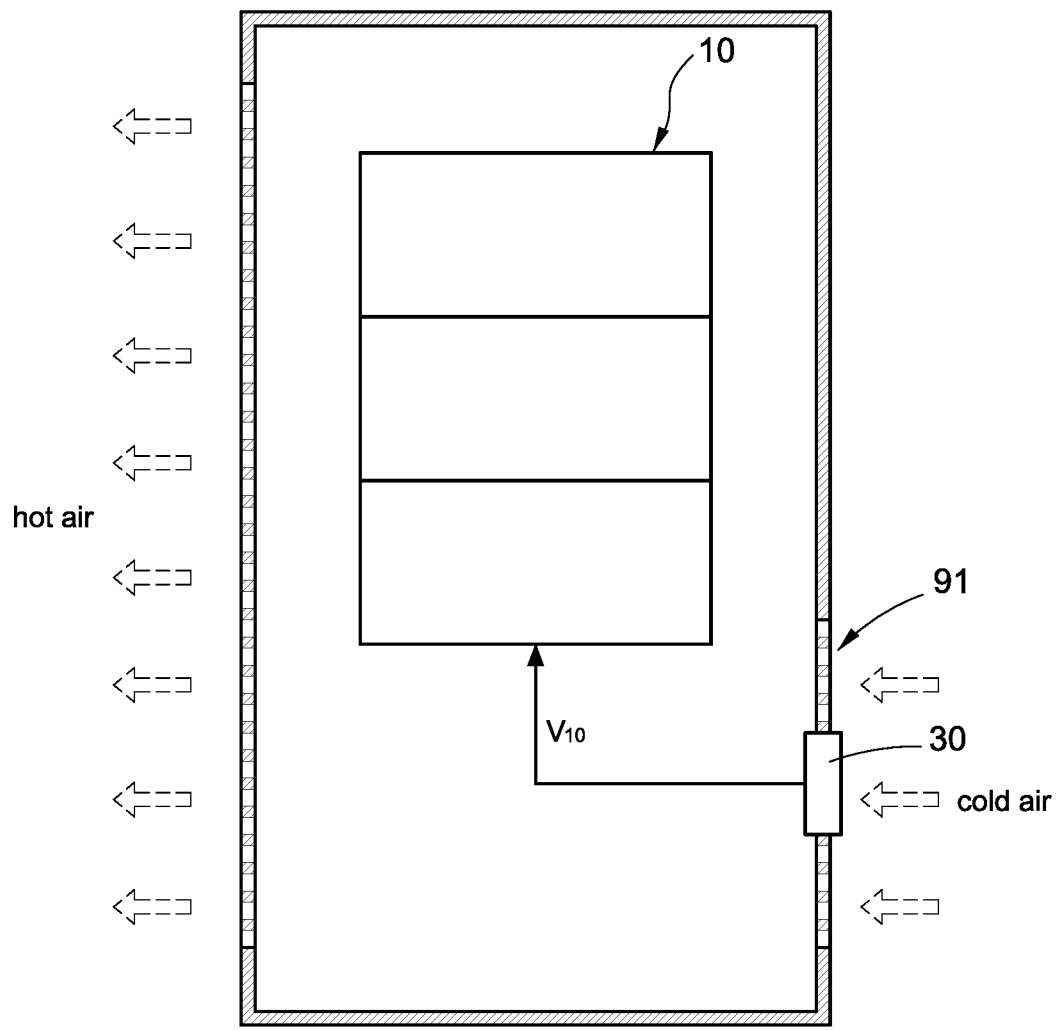
FIG. 6B is a schematic diagram of a charging module for electric vehicle using air to dissipate heat according to a second embodiment of the present disclosure.

FIG. 6B illustrates a schematic diagram of the charging module for electric vehicle using air to dissipate heat according to a second embodiment of the present disclosure. In this embodiment, the thermoelectric module 30 is arranged at an air inlet 91 of the cabinet, and one end of the thermoelectric module 30 is exposed inside the cabinet and the other end thereof is exposed outside the cabinet. Similarly, the cold air is drawn/blown into the cabinet through the air inlet 91 and carried the heat generated by the power conversion unit 10 out of the cabinet, thereby cooling the power conversion unit 10. During the heat dissipation, one end of the thermoelectric module 30 is exposed inside the cabinet to receive the internal temperature (first temperature) of the cabinet. Meanwhile, the other end of the thermoelectric module 30 is exposed outside the cabinet to receive the temperature (second temperature) outside the cabinet. Therefore, with two ends of the thermoelectric module 30 in contact with (receives) two different temperatures at the same time (that is, the first temperature is higher than the second temperature), the thermoelectric module 30 can convert the heat energy into the electrical energy to provide the supply voltage $V_{10}$ to the power conversion unit 10 and a supply voltage to a fan device or a heat dissipation fan (not shown) for operation.

Figure 6C:
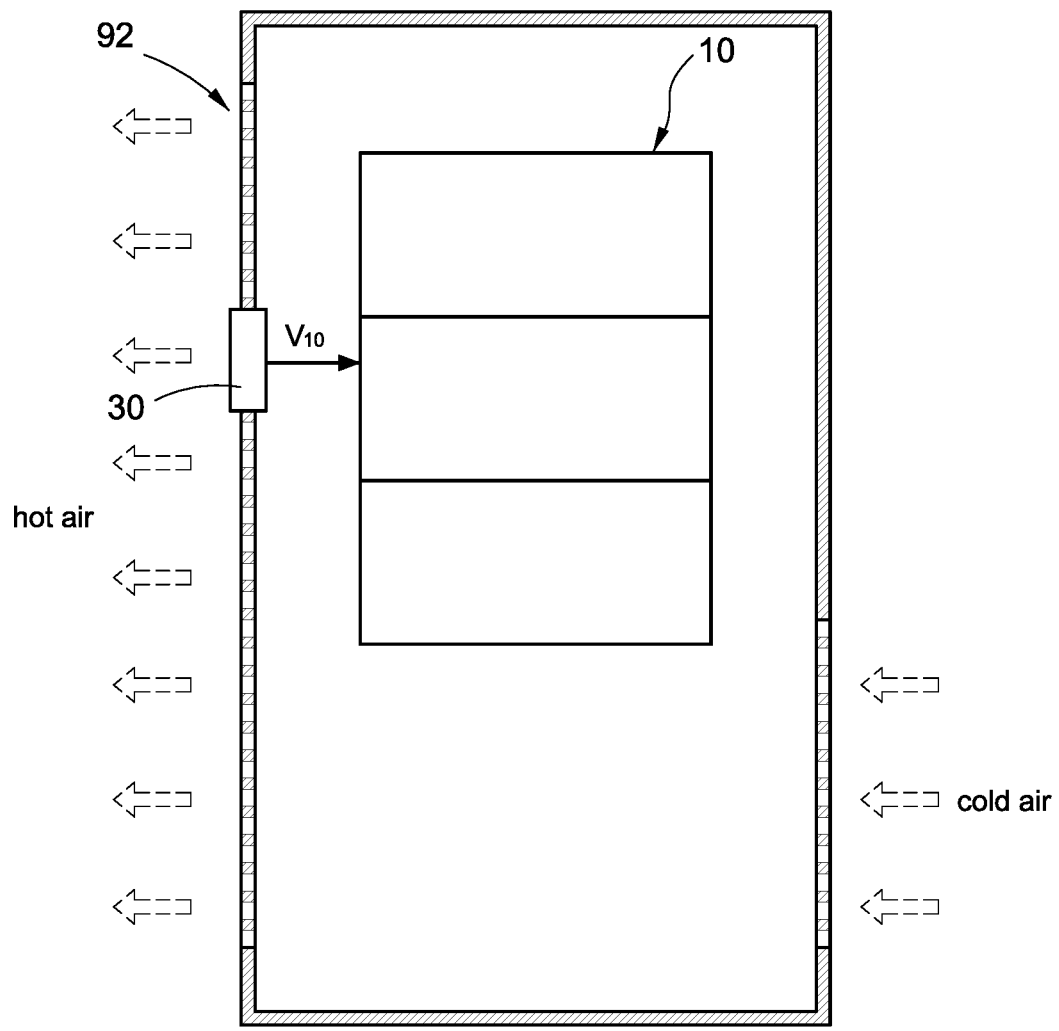
FIG. 6C is a schematic diagram of a charging module for electric vehicle using air to dissipate heat according to a third embodiment of the present disclosure.

FIG. 6C illustrates a schematic diagram of the charging module for electric vehicle using air to dissipate heat according to a third embodiment of the present disclosure. In this embodiment, the thermoelectric module 30 is arranged at an air outlet 92 of the cabinet, and one end of the thermoelectric module 30 is exposed inside the cabinet and the other end thereof is exposed outside the cabinet. Similarly, the cold air is drawn/blown into the cabinet through the air inlet 91 and carried the heat generated by the power conversion unit 10 out of the cabinet through the air outlet 92, thereby cooling the power conversion unit 10. During the heat dissipation, one end of the thermoelectric module 30 is exposed inside the cabinet to receive the internal temperature (first temperature) of the cabinet. Meanwhile, the other end of the thermoelectric module 30 is exposed outside the cabinet to receive the temperature (second temperature) outside the cabinet. Therefore, with two ends of the thermoelectric module 30 in contact with (receives) two different temperatures at the same time (that is, the first temperature is higher than the second temperature), the thermoelectric module 30 can convert the heat energy into the electrical energy to provide the supply voltage $V_{10}$ to the power conversion unit 10 and a supply voltage to a fan device or a heat dissipation fan (not shown) for operation.

In other embodiments, the position arrangement of the thermoelectric module 30 is not limited to those disclosed in FIG. 6A, FIG. 6B, and FIG. 6C. In other words, the thermoelectric module 30 may be arranged in a position sensitive to the temperature in the cabinet. Alternatively, a plurality of thermoelectric modules 30 may be arranged in/on/at different positions at the same time, such as on the power conversion unit 10 (shown in FIG. 6A), at the air inlet 91 of the cabinet (shown in FIG. 6B), and at the air outlet 92 of the cabinet (shown in FIG. 6C). Similarly, with two ends of the thermoelectric modules 30 in contact with (receives) two different temperatures at the same time, the thermoelectric modules 30 can convert the heat energy into the electrical energy to provide the supply voltage $V_{10}$ to the power conversion unit 10 and a supply voltage to a fan device or a heat dissipation fan (not shown) for operation.

In summary, the present disclosure has the following features and advantages: using a simple circuit component, i.e., the thermoelectric module, to convert the heat energy into the electrical energy to provide the required power for system devices, thereby achieving environmental protection, energy saving, and better economic benefit through the recovery and reuse of the heat energy.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A charging module for an electric vehicle, comprising:
a power conversion unit comprising a power conversion module disposed inside a cabinet, said power conversion unit configured to provide an output power,
a heat dissipation unit configured to cool the power conversion unit,
a thermoelectric module configured to generate an electrical energy based on a temperature difference between the power conversion unit and the heat dissipation unit during operation,
a first power converter coupled to the thermoelectric module, said first power converter configured to receive a first power and convert the first power into a second power,
a power storage unit coupled to the first power converter, said power storage unit configured to receive the second power to store energy, and
a second power converter coupled to the first power converter and the power storage unit, said second power converter configured to receive the second power and convert the second power into the electrical energy,
wherein the electrical energy is supplied to the power conversion unit and/or the heat dissipation unit.

2. The charging module of claim 1, wherein the heat dissipation unit is a liquid cooling pump when liquid cooling is performed.

3. The charging module of claim 2, wherein the heat dissipation unit and the thermoelectric module are disposed inside the cabinet.

4. The charging module of claim 3, further comprising a first pipe and a second pipe arranged between the power conversion unit and the liquid cooling pump,
wherein heat generated by the power conversion unit is transferred to the liquid cooling pump through the first pipe, and cold liquid is delivered from the liquid cooling pump to the power conversion unit through the second pipe,
wherein the thermoelectric module receives a first temperature of the first pipe and a second temperature of the second pipe, and generates the electrical energy based on the temperature difference between the first temperature and the second temperature.

5. The charging module of claim 2, wherein the heat dissipation unit and the thermoelectric module are not disposed inside the cabinet.

6. The charging module of claim 5, further comprising a first pipe and a second pipe arranged between the power conversion unit and the liquid cooling pump,
wherein heat generated by the power conversion unit is transferred to the liquid cooling pump through the first pipe, and cold liquid is delivered from the liquid cooling pump to the power conversion unit through the second pipe,
wherein the thermoelectric module receives a first temperature of the first pipe and a second temperature of the second pipe, and generates the electrical energy based on the temperature difference between the first temperature and the second temperature.

7. The charging module of claim 1, wherein the heat dissipation unit is a cooling fan when air cooling is performed.

8. The charging module of claim 7, wherein the heat dissipation unit is disposed inside the cabinet.

9. The charging module of claim 8, wherein the thermoelectric module is arranged on the power conversion unit and configured to receive a first temperature of the power conversion unit and a second temperature inside the cabinet, and to generate the electrical energy based on the temperature difference between the first temperature and the second temperature.

10. The charging module of claim 8, wherein the thermoelectric module is arranged at an air inlet and configured to receive a first temperature inside the cabinet and a second temperature outside the cabinet, and to generate the electrical energy based on the temperature difference between the first temperature and the second temperature.

11. The charging module of claim 8, wherein the thermoelectric module is arranged at an air outlet and configured to receive a first temperature inside the cabinet and a second temperature outside the cabinet, and to generate the electrical energy based on the temperature difference between the first temperature and the second temperature.

12. The charging module of claim 1, further comprising:
a power distribution unit disposed inside the cabinet or not inside the cabinet.

13. The charging module of claim 1, wherein the first power converter is an AC-to-DC converter or a DC-to-DC converter.

14. The charging module of claim 1, wherein the second power converter is a DC-to-DC converter or a DC-to-AC converter.

15. The charging module of claim 1, wherein the thermoelectric module is a thermoelectric generator.

16. The charging module of claim 1, wherein the output power is configured to be supplied to a charging apparatus.

17. The charging module of claim 1, wherein the charging module is disposed inside a charging apparatus, and the output power is configured to be supplied to the charging apparatus.

18. The charging module of claim 1, wherein the power conversion module is an AC-to-DC converter.

* * * * *